(12) United States Patent
Patel et al.

(10) Patent No.: US 8,930,152 B2
(45) Date of Patent: Jan. 6, 2015

(54) WHOLE STRUCTURE CONTACTLESS POWER CONSUMPTION SENSING

(75) Inventors: Shwetak Patel, Seattle, WA (US); Matthew S. Reynolds, Seattle, WA (US)

(73) Assignee: University of Washington, Seattle, WA (US)

( * ) Notice: Subject to any disclaimer, the term of this patent is extended or adjusted under 35 U.S.C. 154(b) by 280 days.

(21) Appl. No.: 12/567,561

(22) Filed: Sep. 25, 2009

(65) Prior Publication Data
US 2011/0074382 A1  Mar. 31, 2011

(51) Int. Cl.
| | | |
|---|---|---|
| G01R 21/00 | (2006.01) | |
| G01R 15/20 | (2006.01) | |
| G01R 35/00 | (2006.01) | |
| G01R 21/06 | (2006.01) | |
| G01R 22/06 | (2006.01) | |

(52) U.S. Cl.
CPC ............ *G01R 15/207* (2013.01); *G01R 35/005* (2013.01); *G01R 21/06* (2013.01); *G01R 22/063* (2013.01); *G01R 21/001* (2013.01)
USPC ........................................... 702/62; 702/104

(58) Field of Classification Search
CPC ............ G01R 33/0035; G01R 33/096; G01R 33/091; G01R 33/007; G01R 35/005
USPC .......................................................... 702/62
See application file for complete search history.

(56) References Cited

U.S. PATENT DOCUMENTS

| | | | |
|---|---|---|---|
| 3,714,516 A | 1/1973 | Howe | 317/104 |
| 4,612,617 A | 9/1986 | Laplace, Jr. et al. | 364/483 |
| 4,706,073 A | 11/1987 | Vila Masot | |
| 4,716,409 A | 12/1987 | Hart et al. | |
| 4,804,957 A | 2/1989 | Selph et al. | 340/870.03 |

(Continued)

FOREIGN PATENT DOCUMENTS

| | | | | |
|---|---|---|---|---|
| CN | 20121017 Y | 3/2009 | | B21D 22/20 |
| DE | 102007032053 | 1/2009 | | G05B 24/02 |

(Continued)

OTHER PUBLICATIONS

Hart, George W., Nonintrusive Appliance Load Monitoring, Proceedings of the IEEE, vol. 80, No. 12, Dec. 1992, pp. 1870-1891.*

(Continued)

*Primary Examiner* — John Breene
*Assistant Examiner* — Timothy H Hwang
(74) *Attorney, Agent, or Firm* — Wilson Sonsini Goodrich & Rosati

(57) ABSTRACT

A contactless current and power consumption sensor can be safely mounted on a circuit breaker box of a structure, so as to sense the current flow and/or power consumed in the structure. Because the sensor can be mounted on a surface of the circuit breaker box without the need to access energized conductors inside the box, an unskilled person can readily install the sensor to monitor total instantaneous current flow and thus, determine the power consumed by energized devices in the structure on a continuing basis. The output from the sensor can be supplied to a readout or can be conveyed by a wired or wireless link to a computing device disposed at a remote location, where the data can be stored or viewed on a display. By integrating the power consumed over time, the energy usage by the energized devices in a structure can also be determined.

31 Claims, 6 Drawing Sheets

(56) References Cited

U.S. PATENT DOCUMENTS

| | | | |
|---|---|---|---|
| 4,858,141 A | 8/1989 | Hart et al. | 364/483 |
| 4,891,587 A | 1/1990 | Squire | |
| 5,229,753 A | 7/1993 | Berg et al. | |
| 5,233,342 A | 8/1993 | Yashiro et al. | |
| 5,268,666 A | 12/1993 | Michel et al. | |
| 5,276,629 A | 1/1994 | Reynolds | 364/487 |
| 5,409,037 A | 4/1995 | Wheeler et al. | 137/551 |
| 5,428,342 A | 6/1995 | Enoki et al. | |
| 5,441,070 A | 8/1995 | Thompson | 137/624.11 |
| 5,483,153 A | 1/1996 | Leeb et al. | 324/76.12 |
| 5,534,663 A | 7/1996 | Rivers et al. | |
| 5,590,179 A | 12/1996 | Shincovich et al. | 379/107 |
| 5,600,310 A | 2/1997 | Whipple et al. | |
| 5,635,895 A | 6/1997 | Murr | 340/310.01 |
| 5,650,771 A | 7/1997 | Lee | |
| 5,699,276 A | 12/1997 | Roos | |
| 5,717,325 A | 2/1998 | Leeb et al. | 324/76.12 |
| 5,808,846 A * | 9/1998 | Holce et al. | 361/93.6 |
| 5,880,677 A | 3/1999 | Lestician | |
| 5,898,387 A | 4/1999 | Davis et al. | 340/870.2 |
| 6,094,043 A | 7/2000 | Scott et al. | |
| 6,147,484 A | 11/2000 | Smith | |
| 6,275,168 B1 | 8/2001 | Slater et al. | 340/870.02 |
| 6,330,516 B1 * | 12/2001 | Kammeter | 702/60 |
| 6,420,969 B1 | 7/2002 | Campbell | |
| 6,728,646 B2 | 4/2004 | Howell et al. | 702/62 |
| 6,771,078 B1 | 8/2004 | McCauley et al. | |
| 6,816,078 B2 | 11/2004 | Onoda et al. | 340/658 |
| 6,839,644 B1 | 1/2005 | Woods et al. | 702/56 |
| 6,853,291 B1 | 2/2005 | Aisa | 340/3.3 |
| 6,906,617 B1 | 6/2005 | Van der Meulen | 340/310.01 |
| 6,949,921 B1 * | 9/2005 | Feight et al. | 324/127 |
| 6,993,417 B2 | 1/2006 | Osann, Jr. | 700/276 |
| 7,019,666 B2 | 3/2006 | Tootoonian Mashhad et al. | 340/870.02 |
| 7,043,380 B2 | 5/2006 | Rodenberg et al. | 702/62 |
| 7,049,976 B2 | 5/2006 | Hunt et al. | 340/870.02 |
| 7,119,533 B2 * | 10/2006 | Tamura et al. | 324/202 |
| 7,276,915 B1 | 10/2007 | Euler et al. | 324/611 |
| 7,330,796 B2 | 2/2008 | Addink et al. | 702/45 |
| 7,400,986 B2 | 7/2008 | Latham et al. | 702/57 |
| 7,460,930 B1 | 12/2008 | Howell et al. | 700/295 |
| 7,493,221 B2 | 2/2009 | Caggiano et al. | 702/61 |
| 7,498,935 B2 | 3/2009 | Kodama et al. | 340/870.02 |
| 7,508,318 B2 | 3/2009 | Casella et al. | 340/870.02 |
| 7,511,229 B2 * | 3/2009 | Vlasak et al. | 174/267 |
| 7,541,941 B2 | 6/2009 | Bogolea et al. | 340/870.02 |
| 7,546,214 B2 | 6/2009 | Rivers, Jr. et al. | 702/62 |
| 7,656,649 B2 | 2/2010 | Loy et al. | 361/659 |
| 7,719,257 B2 | 5/2010 | Robarge et al. | 324/158.01 |
| 7,755,347 B1 * | 7/2010 | Cullen et al. | 324/117 H |
| 8,195,423 B2 * | 6/2012 | Von Zon | 702/154 |
| 8,344,724 B2 | 1/2013 | Leeb et al. | |
| 2001/0003286 A1 | 6/2001 | Philippbar et al. | 137/487.5 |
| 2003/0088527 A1 | 5/2003 | Hung et al. | 705/412 |
| 2003/0097348 A1 | 5/2003 | Cao | 706/12 |
| 2003/0216877 A1 * | 11/2003 | Culler et al. | 702/64 |
| 2004/0128034 A1 | 7/2004 | Lenker et al. | 137/624.12 |
| 2004/0140908 A1 | 7/2004 | Gladwin et al. | 705/412 |
| 2004/0196024 A1 | 10/2004 | Stauth et al. | |
| 2004/0206405 A1 | 10/2004 | Smith et al. | 700/282 |
| 2004/0229578 A1 * | 11/2004 | Lightbody et al. | 455/127.1 |
| 2005/0001486 A1 | 1/2005 | Schripsema et al. | |
| 2005/0067049 A1 | 3/2005 | Fima | 700/284 |
| 2006/0077046 A1 | 4/2006 | Endo | 340/310.11 |
| 2006/0284613 A1 | 12/2006 | Hastings et al. | |
| 2007/0085534 A1 | 4/2007 | Seki et al. | |
| 2007/0132458 A1 * | 6/2007 | Allen, Jr. | 324/523 |
| 2007/0230094 A1 | 10/2007 | Carlson | |
| 2008/0082276 A1 * | 4/2008 | Rivers et al. | 702/62 |
| 2008/0086394 A1 | 4/2008 | O'Neil et al. | 705/34 |
| 2008/0091345 A1 | 4/2008 | Patel et al. | 701/208 |
| 2008/0106241 A1 * | 5/2008 | Deaver et al. | 323/209 |
| 2008/0172192 A1 * | 7/2008 | Banhegyesi | 702/61 |
| 2008/0255782 A1 | 10/2008 | Bilac et al. | 702/60 |
| 2009/0045804 A1 | 2/2009 | Durling et al. | 324/140 |
| 2009/0072985 A1 | 3/2009 | Patel et al. | 340/644 |
| 2009/0115620 A1 * | 5/2009 | Hunter et al. | 340/664 |
| 2009/0224754 A1 * | 9/2009 | Lamarre et al. | 324/251 |
| 2009/0240449 A1 * | 9/2009 | Gibala et al. | 702/62 |
| 2009/0312968 A1 * | 12/2009 | Phillips | 702/62 |
| 2010/0030393 A1 | 2/2010 | Masters et al. | 700/295 |
| 2010/0049456 A1 | 2/2010 | Dempster et al. | |
| 2010/0070214 A1 | 3/2010 | Hyde et al. | 702/61 |
| 2010/0070218 A1 | 3/2010 | Hyde et al. | 702/61 |
| 2010/0088057 A1 | 4/2010 | Kopaczewski et al. | |
| 2010/0109842 A1 | 5/2010 | Patel et al. | 340/10.1 |
| 2010/0188262 A1 | 7/2010 | Reymann et al. | 340/870.02 |
| 2011/0004421 A1 | 1/2011 | Rosewell et al. | 702/45 |
| 2011/0050218 A1 * | 3/2011 | Lohss | 324/251 |
| 2012/0001617 A1 | 1/2012 | Reynolds et al. | |

FOREIGN PATENT DOCUMENTS

| | | | | |
|---|---|---|---|---|
| EP | 0200312 A1 | 11/1986 | | |
| EP | 1 136 829 | 9/2001 | | G01R 21/133 |
| FR | 2 645 968 A | 10/1990 | | G01R 19/12 |
| FR | 2680875 A1 | 3/1993 | | |
| GB | 2228337 A * | 8/1990 | | |
| GB | 2235304 A | 2/1997 | | |
| JP | 10-282161 A | 10/1998 | | G01R 21/00 |
| KR | 10-2008-0114143 | 12/2008 | | G01R 21/00 |
| RU | 2200364 C2 | 3/2003 | | |
| RU | 2402023 C1 | 10/2010 | | |
| WO | WO 93/04377 | 4/1993 | | G01R 21/133 |
| WO | WO 2008/150458 A1 | 12/2008 | | |
| WO | WO 2009/081407 | 7/2009 | | H02J 4/00 |
| WO | WO 2010/007369 | 1/2010 | | G01R 21/133 |
| WO | WO 2012/003426 A2 | 1/2012 | | |

OTHER PUBLICATIONS

Definition of "correlation", thefreedictionary.com, http://www.thefreedictionary.com/p/correlation, last accessed (Oct. 30, 2012).*

Formisano, Bob, How to Safely Turn Off Power at the Electrical Panel, http://homerepair.about.com/od/electricalrepair/ss/turn_off_main_elect_2.htm?p=1, (Picture from 2009), (last accessed Jun. 13, 2013).*

Drenker et al., "Nonintrusive monitoring of electronic loads." *IEEE* pp. 47-51, Oct. 1999.

Hart, George., "Nonintrusive Appliance Load Monitoring." *IEEE Log No. 9206131*, pp. 1871-1892, 1992.

Ramirez-Munoz et al., "Design and experimental verification of a smart sensor to measure the energy and power consumption in a one-phase AC line." *Measurement* vol. 42: 412-419, Aug. 2008.

Tapia et al., "The Design of a Portable Kit of Wireless Sensors for Naturalistic Data Collection." *Pervasive 2006* K.P. Fishkin et al. (Eds.): 117-134, 2006.

Arvola et al., "Billing Feedback as a Means to Encourage Household Electricity Conservation: A Field Experiment in Helsinki." *Proceedings of the 1993 Summer Study of the European Council for Energy Efficient Economy:* 11-21, 2003.

Beckmann et al., "Some Assembly Required: Supporting End-User Sensor Installation in Domestic Ubiquitous Computing Environments." *UbiComp 2004:* 107-124, 2004.

Brandon et al., "Reducing Household Energy Consumption: A Qualitative and Quantitative Field Study." *Journal of Enviromental Psychology:* 75-85, 1999.

Chetty et al., "Getting to Green: Understanding Resource Consumption in the Home." *UbiComp 2008:* 242-251, 2008.

Clifford et al., "A Retrofit 60 Hz Current Sensor for Non-Intrusive Power Monitoring at the Circuit Breaker." 8 pp., 2010.

Darby, Sarah., "The Effectiveness of Feedback on Energy Consumption: A Review for DEFRA on the Literature on Metering, Billing and Direct Displays." *Enviromental Change Institute:* 21 pp., 2006.

Darby, Sarah., "Making it Obvious: Designing Feedback into Energy Consumption." *Proceedings of the Second International Conference on Energy Efficiency in Household Appliances and Lighting:* 11 pp., 2000.

(56) References Cited

OTHER PUBLICATIONS

Fischer, Corinna., "Feedback on Household Electricity Consumption: A Tool for Saving Energy?" *Energy Efficiency:* 79-104, 2008.
Fitzpatrick et al., "Technology-Enabled Feedback on Domestic Energy Consumption: Articulating a Set of Design Concerns." *PERVASIVEcomputing:* 37-44, 2009.
Froehlich, Jon., "Sensing and Feedback of Everyday Activities to Promote Environmentally Sustainable Behaviors." *Thesis Proposal, Computer Science and Engineering, University of Washington:* 35 pp., 2009.
Froehlich et al., "Sensing Opportunities for Personalized Feedback Technology to Reduce Consumption." *UW CSE Technical Report: CSE Sep. 13, 2001:* 7 pp., 2009.
Hirsch et al., "The ELDer Project: Social, Emotional, and Environmental Factors in the Design of Eldercare Technologies." *Conference on Universal Usability 2000:* 72-79, 2000.
Horst, Gale., "Whirlpool Corporation: Woodridge Energy Study and Monitoring Pilot." 1-99, 2006.
Iachello et al., "Privacy and Proportionality: Adapting Legal Evaluation Techniques to Inform Design in Ubiquitous Computing." *CHI 2005:* 91-100, 2005.
Kientz et al., "The Georgia Tech Aware Home." *CHI 2008:* 3675-3680, 2008.
Mountain, Dean., "Price Influences Demand." *DeGroote School of Business, McMaster University:* 16 pp., 2008.
Parker et al., "Contract Report: Pilot Evaluation of Energy Savings from Residential Energy Demand Feedback Devices." *Florida Solar Energy Center, A Research Institute of the University of Central Florida:* 32 pp., 2008.
Patel et al., "At the Flick of a Switch: Detecting and Classifying Unique Electrical Events on the Residential Power Line." *UbiComp 2007:* 271-288, 2007.
Patel, Shwetak., "Bringing Sensing to the Masses: an Exploration in Infrastructure-Mediated Sensing." *Intel Labs:* 133 pp., 2008.
Patel et al., "Detecting Human Movement by Differential Air Pressure Sensing in HVAC System Ductwork: An Exploration in Infrastructure Mediated Sensing." *Pervasive:* 1-18, 2008.
Patel et al., "PowerLine Positioning: A Practical Sub-Room-Level Indoor Location System for Domestic Use." *UbiComp 2006:* 441-458, 2006.
Stuntebeck et al., "Wideband PowerLine Positioning for Indoor Localization." *UbiComp 2008:* 94-103, 2008.
Ueno et al., "Effectiveness of Displaying Energy Consumption Data in Residential Houses—Analysis on how the Residents Respond." *ECEEE 2005 Summer Study—What Works and Who Delivers?:* 1289-1299, 2005.
Wood et al., "Energy-use Information Transfer for Intelligent Homes: Enabling Energy Conservation with Central and Local Displays." *Energy and Buildings,* vol. 39: 495-503, 2007.
N.A., "End-User-Deployable Whole House Contact-Less Power Consumption Sensing." *UbiComp 2009:* 4 pp., 2009.
N.A., "Summary: The Impact of Real-Time Feedback on Residential Electricity Consumption: The Hydro One Pilot." 4 pp., 2006.
N.A., "The Value of Disaggregated Feedback." 1 pg., no date available.
Laughman et al., "Power Signature Analysis." *IEEE Power and Engineering Magazine:* 56-63, 2003.
Murata et al., "Estimation of Power Consumption for Household Electric Appliances." *Proceedings of the 9th International Conference on Neural Information Processing:* 2209-2303, 2002.
Prudenzi, A., "A Neuron Nets Based Procedure for Identifying Domestic Appliances Pattern-of-Use from Energy Recordings at Meter Panel." *IEEE* pp. 941-946, (2002).
International search report and written opinion dated Feb. 28, 2011 for PCT/US2010/043410.
International search report and written opinion dated Dec. 26, 2011 for PCT/US2011/042873.
International search report and written opinion dated Dec. 27, 2011 for PCT/US2011/042877.
Warner. Hall-Effect Sensors Measure Up, ECN Magazine, http://www.ecnmag.com/print/articles/2009/03/sensor-zone-april-2009, Apr. 2009.

* cited by examiner

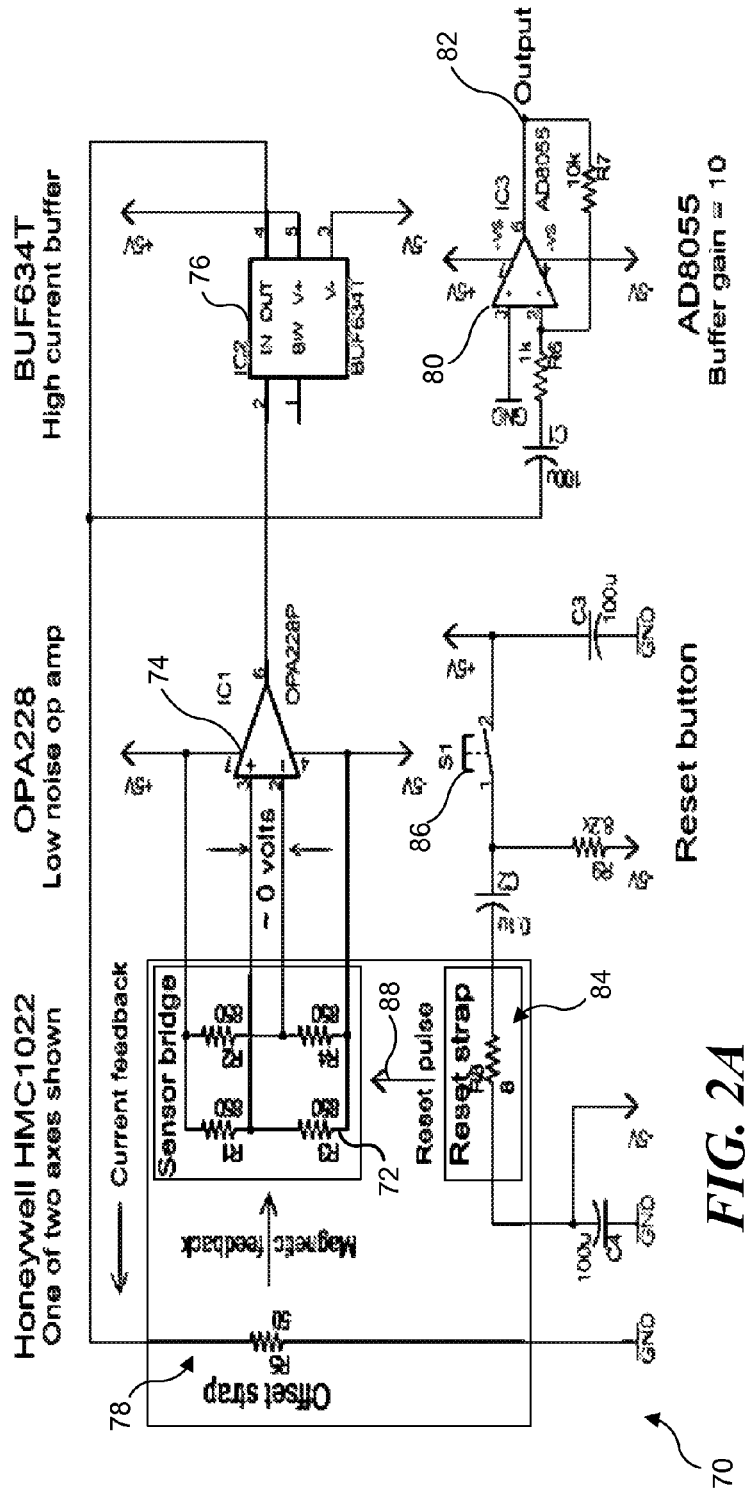
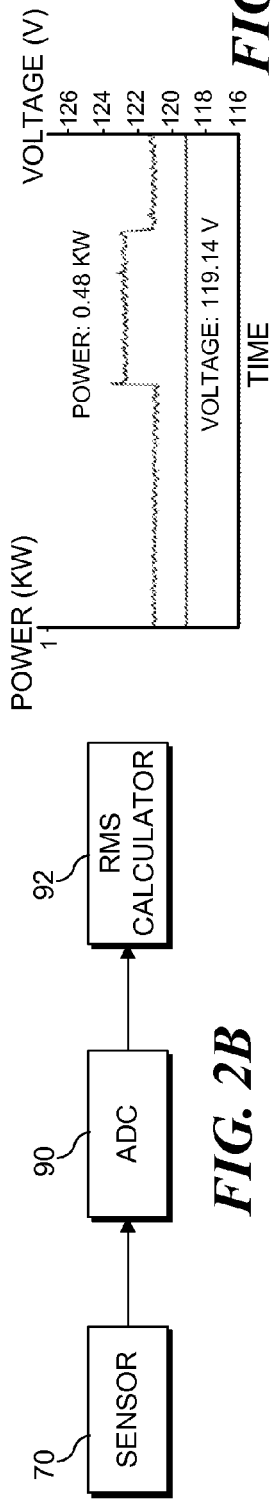
FIG. 2A
FIG. 2B
FIG. 2C

WHOLE STRUCTURE CONTACTLESS POWER CONSUMPTION SENSING

BACKGROUND

Human activities in the home (i.e., those associated with home energy use) are directly responsible for 28% of U.S. energy consumption. Most people, however, are unaware of how their daily activities affect the environment or how often they engage in those activities. Feedback regarding energy consumption, which can provide such awareness, has been shown to be one of the most effective strategies in reducing electricity usage in the home. Thus, with the advent of new sensing technologies and advances in machine learning, it would be desirable to provide personal, relevant feedback about energy usage in real-time, for a variety of energy consuming activities.

Many researchers in the ubiquitous computing (ubicomp) and Human-Computer Interaction communities have seized the opportunity to explore a variety of applications for helping individuals reduce their overall energy use. One particularly important piece of information is real-time, whole house power use, which can be obtained using one of a number of commercially available electric current/power sensors.

However, these sensors typically require professional installation to avoid concerns about the safety of a homeowner who might attempt the job, because the sensors are typically installed around the hot and/or neutral power feeds coming into the home in the main circuit breaker box. Most homeowners are neither trained for this type of installation nor confident (with good reason) that they can accomplish the installation without possibly electrocuting themselves or causing other damage. Accordingly, it would be desirable to employ a contactless, whole house current/power sensor that can easily be installed by an unskilled homeowner and which can enable widespread exploration of electricity monitoring applications. Even if such a sensor is used as a standalone device that simply provides a continuous indication of electrical current and/or power usage within a living structure, the information thus provided can be valuable in enabling the residents to adjust or modify their activities so as to reduce electric power consumption.

The least costly of current sensing devices that can be safely installed by a non-skilled homeowner include the KILL-A-WATT™ and WATTS UP™. However, these devices simply measure the energy used at a single outlet and display the data only on the device at that point. The two most popular and inexpensive whole house sensing systems are THE ENERGY DETECTIVE™ (TED™) and the POWERCOST™ monitor. The TED™ monitor uses a coil-based current sensor installed inside a home's main circuit breaker panel, while the POWERCOST™ monitor uses a sensor attached to the face of the home's power meter. Both devices offer a variety of display modes from current energy consumption in kilowatts or dollars, to energy consumed each day or since the last energy measurement cycle. The POWERCOST™ sensor is the easiest to deploy and can be installed by a homeowner; however, it relies on electromechanical and electronic watt-hour meters that have an exposed optical port. Thus, this solution is constrained to specific types of watt-hour meters and may not, for example, be suitable for apartments, where the power meter might not be easily accessible. It would therefore be desirable to provide an alternative solution that is very flexible and can be used in any home or apartment (or other structure) where there is a circuit breaker panel for the metered space, which is required by many national electrical codes.

Installation of a power monitoring device by an unskilled person should be safe and relatively easy. It should be possible to use such a device for many applications requiring electrical current and/or power usage. For example, by providing an integrator capability, the device should be able to measure energy used by a structure, effectively taking the place of a conventional electromechanical or electronic watt-hour meter. A further benefit of using a contactless current/power and energy measurement device would be to provide time-of-day monitoring of energy consumption, to enable lower cost energy rates to be achieved at minimal cost to both the power utility company and the owner of a structure. These and other applications of an safe and accurate power monitoring device will be evident from the following disclosure.

SUMMARY

An exemplary method is disclosed for contactless sensing of an electrical current flow supplying electrical power to a structure. A used herein, the term "structure" is intended to encompass any building that is provided with a distinct electrical service and serves a designated purpose. Examples of structures include single family residences, apartments, condominiums, townhouses, duplexes, triplexes, quadraplexes, and so forth, as well as commercial structures such as businesses, warehouses, and factories—to list but a few by way of example, but without any intended or implied limitation. While the exemplary embodiments shown and discussed herein are generally shown as being used for measuring electrical current, power, and/or energy supplied to a structure in a single phase power service, it will be understood that the concept is equally applicable to a three phase power service.

The present exemplary method includes the step of affixing a current sensor to a position on a surface of a panel that overlies main electrical lines supplying electrical power to the structure. Such a panel is typically included in an installed circuit breaker box to prevent personnel from contacting the main electrical lines, energized buses, bare wires, and other energized conductors that are covered by the panel. Electrical current flowing in the main electrical lines is sensed with the current sensor, producing an output signal that is indicative of the magnitude of the current. The output signal is then processed to determine the electrical current flowing in the main electrical lines.

While the magnitude of the electrical current flowing in the main electrical lines can be displayed to a user on the front of the sensor, it can also be displayed on a computing device coupled to the contactless current sensor, or on a remote display panel. For example, the method can include the step of conveying an indication of the electrical current flowing in the main electrical lines to a location that is spaced apart from the current sensor, such as to the display panel or to the computing device. Further, this indication can be conveyed by either a wire conductor link or a wireless link.

The method can also include the step of sensing a voltage on at least one of the main electrical lines. A power level for the electrical load in the structure can then be computed as a function of a product of the voltage that was sensed and the electrical current that was determined.

In addition, the method can include the step of computing a reactive power for the electrical current flowing through the electrical load in the structure, which can be of interest if the electrical load is not purely resistive. In this case, the method can include the step of determining a phase difference between the electrical current flowing in one of the main electrical lines and the voltage applied to the load.

The power computed for the electrical load in the structure can be displayed, and the displayed value can be either a true power, a reactive power, and/or an apparent power.

As a further step, the method can provide for integrating the power that was computed over a time interval to determine a total energy consumed by the load in the structure during the time interval. A value for the total energy consumed during at least one time interval can be stored and subsequently conveyed to an entity that determines a payment due for the energy supplied to the structure based on this value for the energy consumed.

To ensure the accuracy of the current measurement, the method can include the step of calibrating the current sensor by selectively energizing a known load for a period of time, while monitoring an indication of the current flowing to the load, based on the output signal of the current sensor. The calibration can also be carried out with a known power load, such as a resistive lamp or a power resistor disposed inside a remote device connected to the electrical system being monitored. The rate at which this load switches from an off to an on state indicates that this load is a test load intended for calibrating the current sensor.

The electrical current flowing in each of the main electrical lines can be sensed using either a magnetoresistive current sensor, a Hall effect current sensor, a fluxgate sensor, or an induction coil. Further, it is desirable to employ a current sensor that has a plurality of sensing elements, including a sensing element overlying each main electrical line (typically two main lines are used for a single phase residential service, but a third sensor would be used to monitor the third main line for three-phase service in some residential structures and for many commercial structures).

The panel on which the current sensor is attached can comprise a surface of an electrical circuit breaker panel. In this case, the current sensor can be removably attached to the surface of the electrical circuit breaker panel, for example, by using an adhesive material, double-stick tape, an epoxy, or other suitable material.

Another aspect of this technology is directed to an exemplary system for monitoring a parameter related to electrical power use in a structure. As noted in connection with the method discussed above, this system includes a contactless electrical current sensor that is configured to be attached to a surface of a panel, at a position overlying electrical main lines supplying electrical power to a structure. This current sensor can thus be attached without removing the panel to expose the main electrical lines and other energized conductors that are covered by the panel. The electrical current sensor senses an electrical current flowing through the main electrical lines and produces an output signal that is indicative of the current. A processing circuit that receives the output signal processes it to determine the parameter that is related to electrical power use. Other details of the system are generally consistent with the steps of the method described above.

This Summary has been provided to introduce a few concepts in a simplified form that are further described in detail below in the Description. However, this Summary is not intended to identify key or essential features of the claimed subject matter, nor is it intended to be used as an aid in determining the scope of the claimed subject matter.

DRAWINGS

Various aspects and attendant advantages of one or more exemplary embodiments and modifications thereto will become more readily appreciated as the same becomes better understood by reference to the following detailed description, when taken in conjunction with the accompanying drawings, wherein.

Figure 1B:
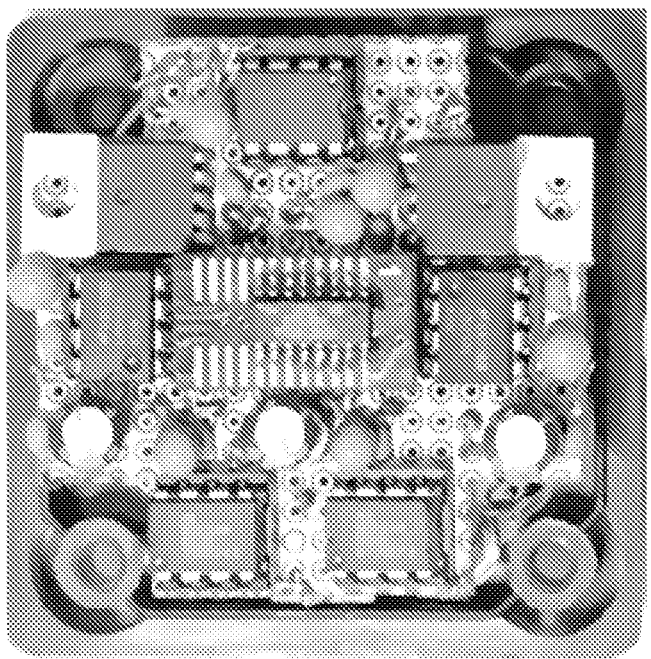
FIG. 1B is a plan view of the interior of the exemplary embodiment shown in FIG. 1A (opposite side), illustrating internal circuit components.
Figure 1A:
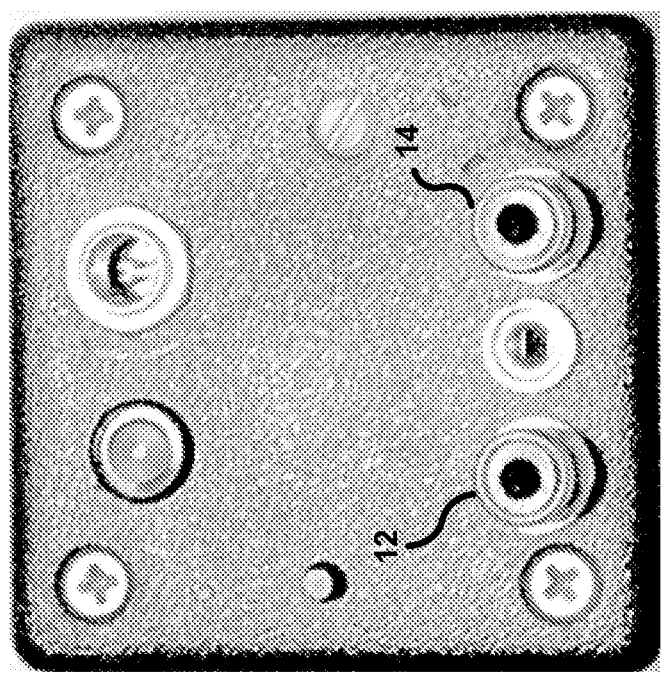
FIG. 1A is a plan view of the outer surface of an exemplary embodiment of a contactless current/power sensor as disclosed herein.
Figure 1C:
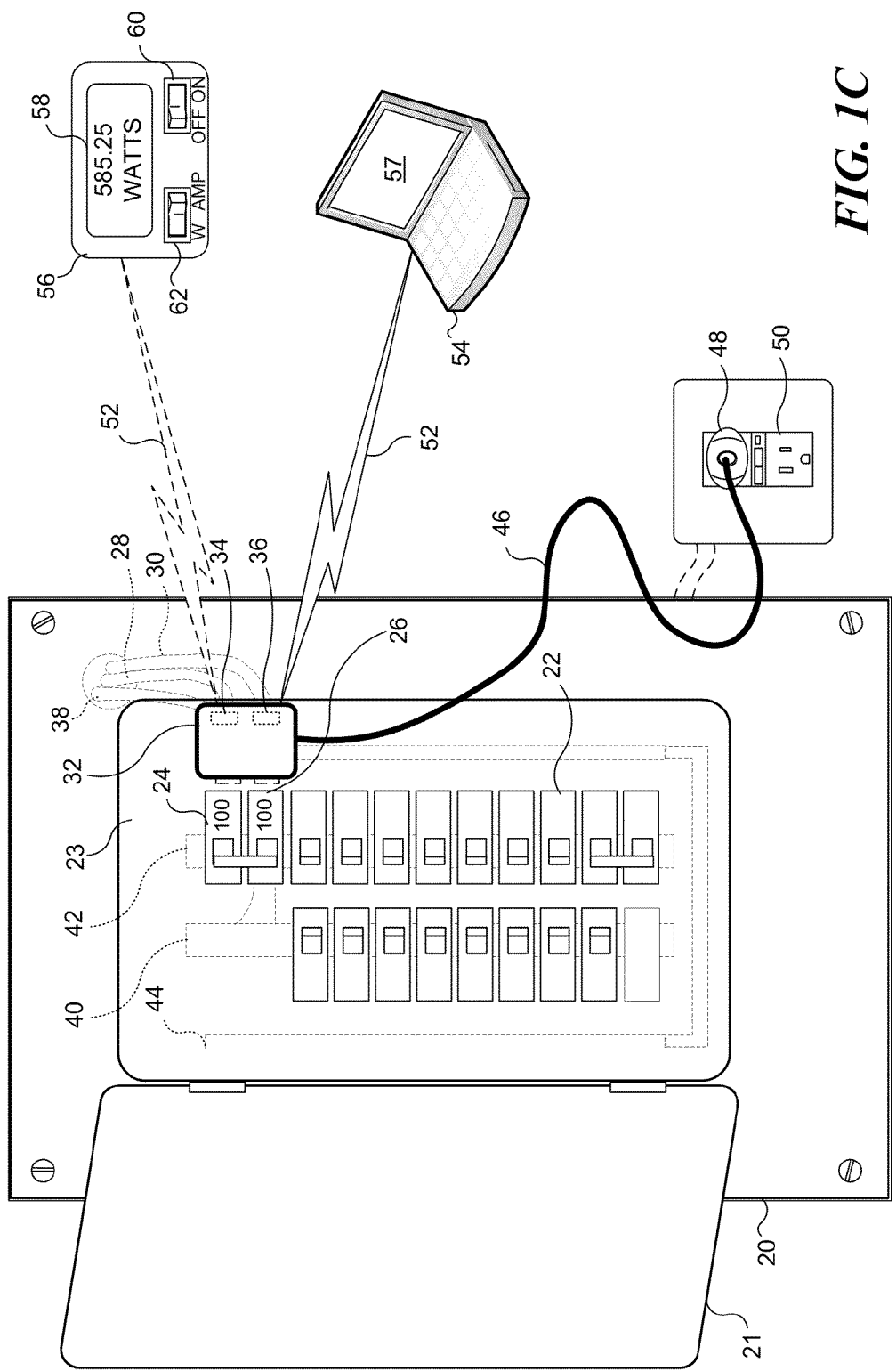
Figure 3A:
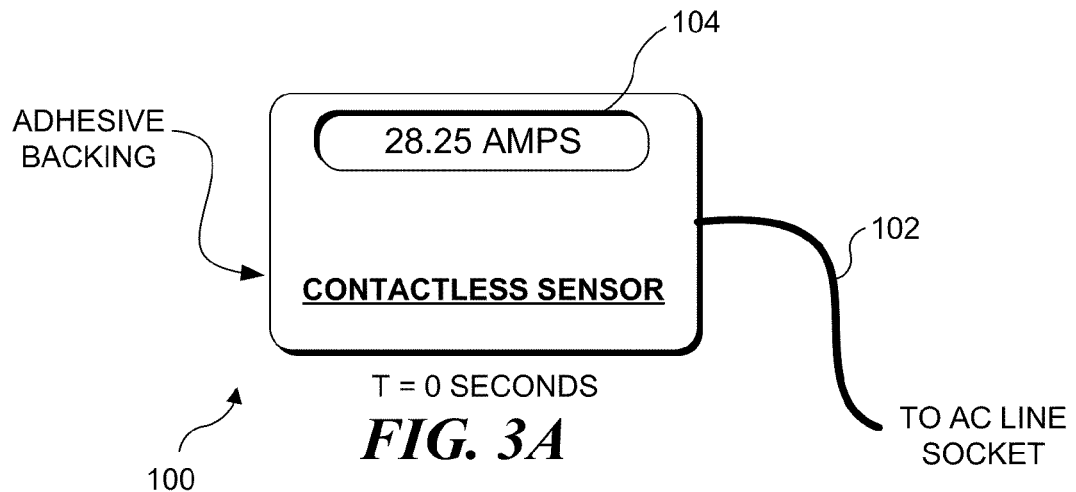
Figure 3B:
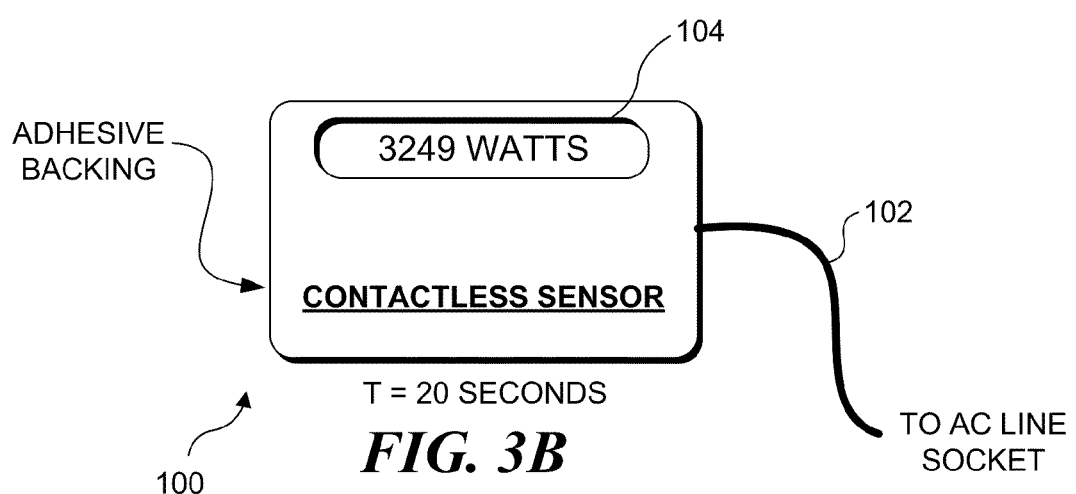
Figure 3C:
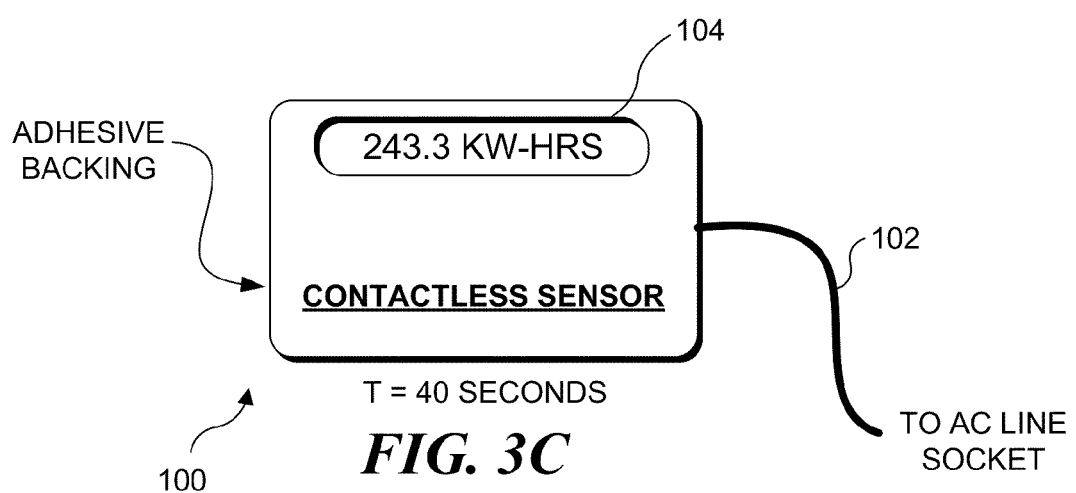
Figure 4:
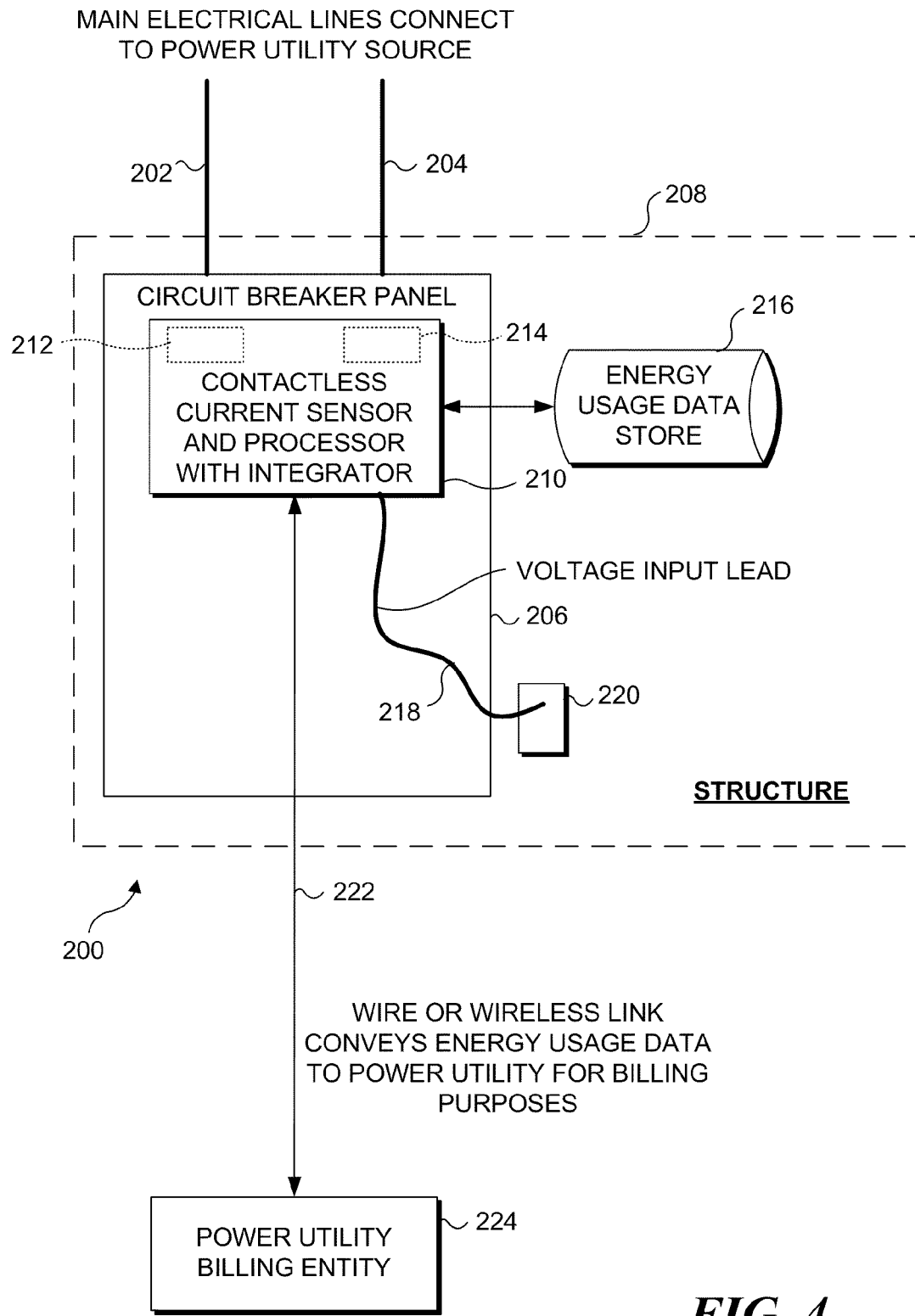
Figure 5:
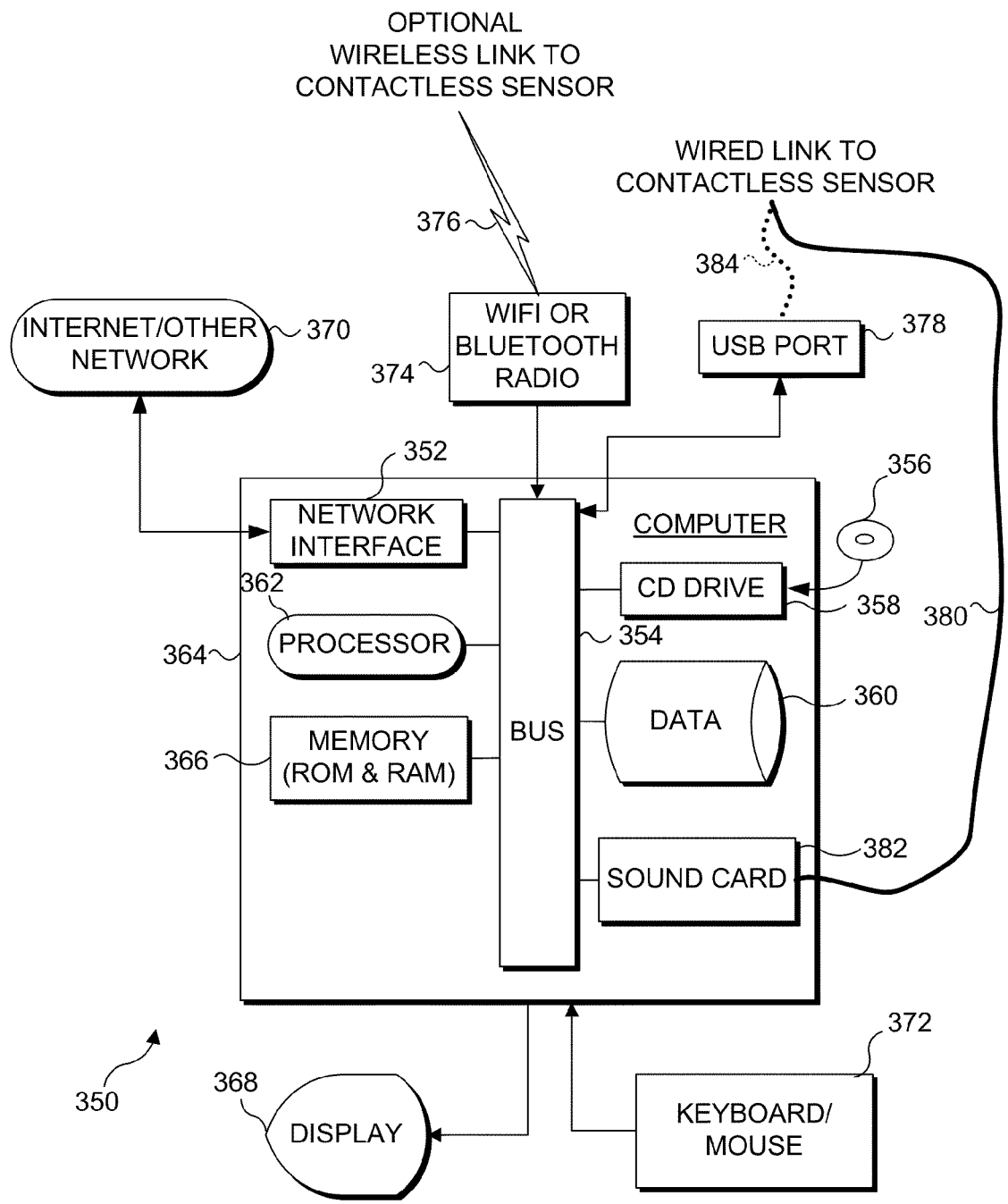

FIG. 1C is a partial phantom view of an exemplary electrical circuit breaker panel, showing a wireless communication contactless sensor (otherwise generally similar to that shown in FIGS. 1A and 1B) mounted to the surface of the circuit breaker enclosure, at a position that overlies the main conductors (which are inside the circuit breaker box) that convey electrical current to the circuit breaker buses and also showing two options for displaying (and/or processing) the output signal sent by a wireless communication link;

FIG. 2A is an exemplary schematic circuit diagram of one axis of the contactless sensor for monitoring current/power on one line supplying electrical current to a structure;

FIG. 2B is an exemplary block diagram illustrating the contactless current sensor, an analog-to-digital converter (ADC), and a root-mean-square (RMS) calculator that are coupled together to produce an output signal that is indicative of the RMS value for electrical current sensed in a power line by the sensor;

FIG. 2C illustrates a graph showing exemplary power and voltage signals determined using the present approach;

FIGS. 3A-3C respectively illustrate another exemplary embodiment of the contactless current sensor with a display that cycles through indicating electrical current in amps (FIG. 3A), power in watts (FIG. 3B), and energy used (during a current time period) in kilowatt-hours (FIG. 3C);

FIG. 4 is an exemplary block diagram illustrating how the energy determined using a contactless current sensor can be stored in a memory and output to a power utility billing entity (or other recipient), for example, for purposes of billing for the energy use; and FIG. 5 is a schematic block diagram of a typical computing device that is suitable for use in processing the signal output received from a contactless current sensor to determine electrical current, power, and/or energy used by a structure.

DESCRIPTION

Figures and Disclosed Embodiments Are Not Limiting

Exemplary embodiments are illustrated in referenced Figures of the drawings. It is intended that the embodiments and Figures disclosed herein are to be considered illustrative rather than restrictive. No limitation on the scope of the technology and of the claims that follow is to be imputed to the examples shown in the drawings and discussed herein.

Contactless Current Sensing

Theory of Operation

An exemplary embodiment of a contactless current sensor 10, which is shown in FIGS. 1A and 1B, responds to an electrical current based on an anisotropic magnetoresistive (AMR) effect. This sensor thus produces an output signal that is indicative of current flow in an adjacent conductor. FIG. 1A illustrates output signal ports 12 and 14 that can be coupled through leads to a computing device, such as a conventional personal computer, or to dedicated processor and display (neither shown in this Figure). FIG. 1B illustrates the internal electronic components that are mounted on a circuit board 16 (visible with the back cover of the housing removed) in contactless current sensor 10.

In this type of current sensor, a change in the resistance of ferromagnetic materials occurs in response to a changing magnetic field that interacts with the ferromagnetic materials. An AMR sensor element comprises, for example, a nickel-iron alloy deposited as a thin film on a silicon substrate. For each axis (e.g., X and Y axes) of this two axes AMR sensor, four such variable resistive elements are arranged to form a Wheatstone bridge. A constant current is applied to the bridge, and in response to an applied magnetic field, the resistance of two of the resistive elements of the bridge increases, while the resistance of the other two resistive elements of the bridge decreases. This overall change in resistance of the bridge results in a voltage change at the bridge output, which is detected and amplified, producing an output signal that serves as an indication of the electrical current flowing in an adjacent conductor that is being monitored. FIG. 2 illustrates details of an exemplary circuit for producing an output signal in regard to one of the two orthogonal axes of a current sensor for one of the main lines supplying power to a structure, and details of this exemplary circuit are discussed below. A similar circuit is used for the other axis, and another two axes current sensor is employed to sense the current in the other main electrical lead supplying power to a structure in this exemplary embodiment.

Magnetoresistive (MR) sensor elements that are available from Honeywell Corporation were used in this exemplary embodiment of the device; the MR current sensor used for each axis includes two on-chip metal straps. An offset strap is provided to enable the current sensor to be operated in a closed-loop mode for best performance. A reset strap is provided and is periodically activated (as needed) to realign the magnetic domains of the sensor elements, which can eliminate the effect of the elements being magnetized due to exposure to strong magnetic fields. In addition, the offset strap is used to create a magnetic field that just cancels the sensed magnetic field of the conductor, so that the sensor elements operate in a near-zero magnetic field, where their linearity is greatest. The offset strap also enables measurement of magnetic fields that are stronger than the nominal sensor capacity (e.g., to enable measurement of the current supplied to greater electrical loads, such as electric driers, electric ovens and grills, and resistive heating elements used in electric water heaters—to name a few examples, without any implied limitation).

MR sensors offer several advantages over other magnetic sensing technologies. Compared to current transformers, MR sensors are smaller, lighter, and have a wider bandwidth and greater dynamic range. A large dynamic range enables the measurement of small changes in a large current, e.g., detecting when a night light is switched on (low current draw) while the HVAC system (high current draw) is running MR sensors are more sensitive than Hall effect sensors and can be deployed at some distance from a current-carrying wire. Although fluxgate sensors are more sensitive than MR sensors, their support circuitry is more complex, and they typically do not deliver truly continuous measurements.

Implementation Details

The Honeywell HMC1022™ MR two axes sensor contains two sensor dies placed at right angles to each other in a 16 pin small-outline integrated circuit (SOIC) package; this package is one of the internal electronic components shown in FIG. 1B. Sensitivity for this device is greatest for magnetic fields that are normal to the sensor plane and which are aligned along the X axis (die A), or along the Y axis (die B). Identical circuits support each die. One exemplary circuit 70 (for only one axis) is shown in FIG. 2A.

As shown in FIG. 2A, the sensor operates in a closed-loop configuration to achieve high linearity and dynamic range. A sensor bridge 72 includes four AMR resistive elements R1, R2, R3, and R4 coupled in a Wheatstone bridge configuration. The sensor bridge output is supplied to an OPA228™ operational amplifier 74, which has a low input offset-voltage, low noise, and a 33 MHz small signal gain bandwidth product. The OPA228™ operational amplifier is designed to drive relatively high impedance loads, so a BUF634T™ amplifier 76 boosts the signal current for driving a 50 ohm offset strap resistance 78. The feedback loop formed by the sensor bridge, the two amplifiers, and the offset strap works to maintain a zero voltage between the OPA228™ operational amplifier input terminals. Thus, this configuration maintains a near zero magnetic field at the sensor bridge, and the linearity of the current sensor is greatest under this condition. Current flowing through the offset strap is converted to a voltage by offset strap resistance 78, and this voltage is amplified and supplied to an output port 82 by an AD8055™ low noise, 300 MHz operational amplifier 80.

A reset strap 84 is provided to maintain sensor bridge performance by correctly aligning the magnetic domains within the bridge elements. The domains become misaligned when subjected to strong magnetic fields, such as those from a permanent magnet or those generated by the offset strap as the circuit initially powers up. As a result, the sensor bridge becomes less sensitive and responds with less linearity to applied magnetic fields. The reset circuit is used after power up to apply a brief pulse of high current through the resistance of reset strap 84, which restores proper alignment of the domains in the sensor bridge. A reset button 86 is provided for manually applying this brief pulse 88 of high current to the reset strap, but it will be understood that a corresponding electronic reset switch can optionally be controlled by a computing device or other logic circuit to close the reset button automatically when conditions are detected that indicate a need to restore the proper alignment of the domains in the sensor bridge.

Schematic circuit 70 in FIG. 2A indicates that a bipolar power supply is being used and, for clarity, omits the supply decoupling capacitors that are included in the circuit. An exemplary prototype circuit was constructed using a 12 volt unipolar power supply, with virtual grounds for the offset strap being provided by LM7171™ operational amplifiers (not shown). Apart from the difference in grounding, components in the signal path for this prototype are identical to those in the schematic of FIG. 2A.

The frequency response of circuit 70 and of the MR current sensors is more than adequate for sensing power line currents. A response rise of about 2.5 dB between 10 kHz and 1 MHz was observed in the prototype contactless current sensor and is probably due to inductance in the current feedback loop connected to offset strap resistance 78. However, this response rise does not significantly affect the audio frequency data collected for the experiments that are discussed below.

RMS Calculation

Exemplary circuit 70 for the contactless current sensor produces an analog output signal indicative of the electrical current in the electrical line being monitored. As shown in FIG. 2B, his analog signal is input to an analog-to-digital converter (ADC) 90 through a low-pass filter (not separately shown) to help isolate the 60 Hz cycle of the electrical current. Next, the root mean square (RMS) value of the AC sinusoidal current indicative signal is calculated for the sensor on each electrical main line using an RMS calculator 92. The total current consumption (in raw signal space) can be computed by summing the RMS values of these RMS signals for each main line being monitored. A correction factor is applied to convert the raw RMS value to the actual total current being supplied to the load in a structure. The conversion factor that is applied to the raw RMS value is determined by having the calibrator sequence through its known loads and computing a linear function that will implement the conversion. As long as the sensors attached to the breaker panel are not moved after calibration, it has been determined that a linear equation is sufficient to model the transfer function between the raw RMS signal indicative of electrical current and the actual RMS value of the electrical current. FIG. 2C is a graph illustrating exemplary voltage and power signals as determined using this approach.

The 1 Hz pulse rate is used when cycling the known loads from an off state to an on state to discriminate the calibration loads from other loads in the structure that may actuate in the background. For example, by observing four subsequent raw RMS signal values of increasing magnitude, it is possible to associate the respective values of the known loads with the corresponding raw RMS values for those known loads. The step change in the raw RMS signal space is correlated to the calculated current draw of the known load (using the line voltage). This is computed for each of the fours known load states of the calibrator. Five samples of each are taken and then averaged, before computing the linear function used to convert from raw RMS values to true electrical current. The linear function can then be used to determine the necessary RMS current values for the loads in the structure. Finally, the average power is calculated using the RMS voltage and total RMS current. The following section provides further details about sensing the power consumed in a structure.

Sensing the Power Consumed in a Structure

The exemplary contactless current sensor described above includes two magnetoresistive sensors that are positioned side-by-side to provide effective coverage of the magnetic field generated by both 120 V main electrical lines of a standard 240 V single phase power feed from the AC source supplying electrical power to a residential structure. As shown by the exemplary diagram in FIG. 1C, a conventional circuit breaker panel 20 includes a plurality of circuit breakers 22 and two main breakers 24 and 26 that are accessible by opening a door 21. A person accessing the toggles on circuit breakers 22 and/or main breakers 24 and 26 is protected from inadvertently contacting energized conductors and buses 40 and 42 to which these breakers are coupled, by an overlying panel 23 that surrounds the breakers and covers the power buses, the main electrical lines, and the bare ends of electrical lines that distribute power from the circuit breakers throughout the structure.

Main electrical lines 28 and 30 are connected to main breakers 24 and 26, which in turn, are connected to power buses 40 and 42. A neutral line 38 that enters the structure with the main electrical lines is coupled to a neutral bus 44, which is also disposed behind panel 23. An exemplary contactless current/power sensor 32 is adhesively attached to panel 23 in a position so that current sensor circuits 34 and 36 within the current/power sensor overlie main electrical lines 28 and 30. One end of a line cord 46 is connected to circuitry within the contactless current/power sensor, and the other end is connected to a conventional alternating current (AC) line plug 48, which is inserted into a nearby AC power socket 50. In this example, AC power socket 50 is shown as being configured as a ground fault detector, but a conventional AC power socket can also be used.

The AC socket provides the voltage level on the electrical lines within the structure for at least one of the main lines, and this voltage is typically about the same on the other main line. The contactless current/power sensor can detect the power factor or phase angle between the voltage on one of the two main lines and the current flowing through that line, and can detect a phase difference between the two main lines. Thus, the phase angle or power factor for the load connected to the other main line can also be determined.

The power factor can be used to determine reactive power, which is equal to the product of volts, current, and power factor. A purely resistive load has a power factor equal to one, while inductive loads cause a negative power factor less than one, and capacitive loads cause a positive power factor less than one. If desired, the reactive power can be displayed on a computing device, on the remote display, or on a display provided on the contactless current/power sensor itself. A user may want to observe the reactive power, if the load in the structure is not purely resistive. For example, the user may want to observe the reactive power for a structure that includes a significant inductive load due to several energized electric motors.

The data from the current sensor elements overlying the main electrical lines are input to an analog-to-digital converter (ADC) within the current/power sensor, where the 60 Hz cycle is observed to detect its magnitude. Similarly, the voltage signal monitored at socket 50 is input to an ADC within the current/power sensor, to determine the voltage magnitude during the 60 Hz cycle. The root mean square (RMS) values of the current signals (for both of the main electrical lines), and for the voltage signal are computed, and the sum of the two current RMS magnitudes is multiplied by the RMS voltage to compute the total power being consumed in the structure (i.e., both reactive and actual power).

The determination of both current and power used in the structure can be carried out by a processor included within current/power sensor 32 or the sensed current and voltage signal data for these parameters can be supplied to a computing device, such as a laptop 54, either by a wire link (e.g., Ethernet or powerline data link, etc.), or through a wireless link 52 (e.g., an IEEE 802.11a, b, g, or n specification WiFi link, a Bluetooth link, or other wireless data link) The computing device can then determine the current, power, and/or energy and can display one or all of these parameters on a display screen 57 provided for the computing device.

As a further alternative, the power and current that was determined by contactless current/power sensor, or the sensed current and voltage signal data that it measured can be conveyed by a wire link or by wireless link 52 to a remote display panel 56 that includes a liquid crystal display (LCD) or other display 58 on which the value of a desired parameter is indicated. A user can employ a switch 62 to determine whether power in watts or current in amps is continuously displayed. Alternatively, display 58 can cycle through these parameters, for example, by displaying the value for current for several seconds and then displaying the value for power for several seconds. A switch 60 can be included to disable the remote display panel.

Calibration

A known load is applied in the structure to calibrate the contactless current/power sensor by detecting a change in magnitude of the electrical current being detected, in regard to the current consumption of the known load. For example, if other loads in the structure are using a total of 128.5 amps of current and a load known to use 10 amps of current is connected to the electrical system of the structure, the indication of current in the structure should increase by 10 amps. A series of different electrical loads are applied to compute a regression line. This calibration step can be done automatically by a plug-in device residing anywhere in the structure, or alternatively, can be periodically carried out manually, as desired. Since the contactless current/power sensor is also plugged into nearby power socket 50, the line voltage that is detected can be used to calibrate the calculation of "true power" for each different known load that is coupled to the electrical system in the structure.

For example, in order to associate sensed currents with consumed power, a calibrator (not shown) with a known power consumption (e.g., 100 W) is plugged into a power socket and is periodically pulsed (e.g., at a 1 Hz rate), so that the change in the sensed power detected by current/power sensor 32 can be recorded. The calibrator can be as simple as a blinking light bulb that is a resistive load of a known wattage. If a computing device is linked to current/power sensor 32, a MATLAB™ script can be used to sample the contactless current/power sensor output signal through an uncompressed pulse code modulated (PCM) sound card line-in connection at 44.1 kHz. As noted above, this connection between the contactless current/power sensor can be through a wireless link (e.g., an IEEE 802.11a, b, g, or n specification WiFi link, a Bluetooth link or other such link) or through a direct input to the soundcard line input or through an Ethernet or a powerline communication (PLC) link, or other wire connection.

The power is computed for each cycle of power line current, which, in one exemplary embodiment, comprises 735 audio samples (using a sampling rate of 44,100, divided by a power line frequency of 60 Hz). The mean value of all baseline samples is subtracted from each incoming sample, and an absolute value is computed. The resulting absolute values are then averaged (1/60th sec) and represent an un-calibrated measurement of current consumption. Using the known load of the calibrator, e.g., 100 watts, the ratio of the sensed current consumption data to the actual current draw is computed. The 1 Hz pulse indicates a specific device of interest among a number of loads applied to the power system. Although the calibration device only uses two power states (0 and 100 W), it is also contemplated that a multistate calibrator can be employed that cycles through more different loads (e.g., 0, 50, and 100 W).

As noted above, as a further alternative, the contactless current/power sensor 32 can be provided with an embedded microcontroller, or an application specific integrated circuit (ASIC), or can use a field programmable gate array (FPGA) circuit, to eliminate a connection to a separate computing device; although, it may then be desirable to communicate the output parameters to display panel 56, either through a wire or wireless link.

Instead of using a remote display panel, it may be desirable to simply include a display on the contactless current/power sensor. For example, FIGS. 3A, 3B, and 3C illustrate an exemplary embodiment of a contactless current/power sensor and display 100 that is designed to cycle through three different parameters. This embodiment is also provided with an adhesive backing, so that the contactless current/power sensor can be removably adhesively attached to a surface of a breaker panel in a position overlying the main electrical leads supplying electrical current to the breakers in the panel, and thus, to a structure where the circuit breaker panel is installed. The adhesive can be double-stick tape, an adhesive coating, epoxy, or some other suitable adhesive material. A voltage input from a line socket is provided on a lead 102.

As shown in FIG. 3A, a display of the instant electrical current in amps is shown on a display screen 104 at a time T=0 seconds, while in FIG. 3B, at a time T=20 seconds, the display screen shows the value of power then determined, in watts. Similarly, in FIG. 3C at a time T=40 seconds, the display screen shows the total energy consumed during a defined measurement period. For example, the measurement period may be the incremental time interval between successive uploading of the energy measurements to a power utility company, as discussed in more detail below. Or, the measurement period might be successive 24-hour periods, or some other time intervals, as desired.

Energy Monitoring

To determine the energy consumed by a structure over a time interval, it is only necessary to integrate the power measured over time using an integrator function that is implemented by the processor or as part of an ASIC or FPGA included within the contactless current/power sensor (or as implemented by a remote computing device). Furthermore, it will be evident that the energy consumed in defined times during the day and night and on specific days of the week may be determined and each result stored to enable a convenient time-of-day energy consumption measurement for the structure. Time-of-day energy measurement is often favored by power utility companies to encourage off-peak energy usage, and this approach would be useful in that regard.

FIG. 4 illustrates a block diagram 200 that shows how an embodiment of the contactless current/power sensor with a processor integrating the power measured over time can be used to produce energy consumption data for a structure that is uploaded periodically (or on demand) to a power utility company for purposes of billing the user for the power consumed. Main lines 202 and 204 enter a circuit breaker panel 206 to supply electrical power from the utility company to electrical loads in a structure 208. A contactless current/power sensor 210 with integral processor and integration functionality is attached on a surface of circuit breaker panel 206 with adhesive or otherwise, so that current sensors 212 and 214 respectively overlie main electrical lines 202 and 204. The current sensors are positioned on the circuit breaker panel optimally over the main electrical lines to sense current flow in the lines.

It should be emphasized that the present approach is not limited to single phase or residential installations, and that it can also be employed in commercial installations, for sensing both single phase current/power (using the two main electrical lines shown) or three phase current/power (which would use a contactless current/power sensor having three current sensor elements, with a current sensor element overlying each one of the three main electrical lines entering the circuit breaker box). Also, each of the other embodiments discussed herein can similarly be used for monitoring current, power, and energy supplied to a structure in either a single phase or three phase installation.

As shown in FIG. 4, voltage input lead 218 connects contactless current/power sensor 210 to a conventional power outlet 220, so that the voltage on one of the main electrical lines is input and used to determine power (and optionally, also phase angle/power factor). It should be noted that in some cases, it may be desirable to sense the voltage on each of the main electrical line circuits, if the loads on each line are so unbalanced that the voltages are substantially different. If so, a separate outlet that is connected to each other main electrical line can be used to sense the voltage on that other line in addition to the one shown in FIG. 4.

The energy that is determined by integrating power over time can be stored in an energy usage data store 216 for different periods of time, e.g., to achieve time-of-day energy consumption monitoring as noted above, or for a time interval since the energy used was last uploaded to a power utility billing entity 224 over a wire or wireless link 222. Energy usage data store 216 can be included as a memory circuit within contactless current/power sensor 210 or can be separate, for example in a remote computing device. However, in view of the relatively compact nature of solid-state memory chips, it may be appropriate to include such memory internally to provide the data store within the contactless current/power sensor. The energy usage data for one or a plurality of different time periods can be uploaded to the power utility billing entity according to a calendar schedule, e.g., on the last or first day of each month, or can be uploaded on demand in response to a signal from the power utility billing entity requesting the upload of the data. Also, it will be understood that link 222 can be wireless, e.g., a WiFi, WiMax, or some other wireless link; or, can be a wire link, e.g., an Ethernet connection to the Internet, or a powerline data link, or other suitable wire data link.

Exemplary Computing Device

FIG. 5 illustrates a functional block diagram for a generally conventional computing device 350, that can comprise a computer 364, which is useable to receive the output signal from the contactless current or current/power sensors discussed above. The computer can be programmed to process the output signal from the current sensor to display and/or store the current being supplied to electrical loads in a structure, and to receive the voltage signal. Using these two output signals indicative of the current and voltage, the computer can determine the power being used by electrical loads in the structure by multiplying the current by the voltage. Computer 364 may be a generally conventional personal computer (PC) such as a laptop, desktop computer, server, or other form of computing device. The computer is coupled to a display 368, which is used for displaying text and graphics to the user, such as the present value of current that is being measured, the present power being consumed, and/or the energy that has been used during a time interval.

Included within computer 364 is a processor 362. A memory 366 (with both read only memory (ROM) and random access memory (RAM)), a non-volatile storage 360 (such as a hard drive or other non-volatile data storage device) for storage of data and machine readable and executable instructions comprising modules and software programs, and digital signals, a network interface 352, an optical drive 358, and (optionally) a sound card 382 are coupled to processor 362 through a bus 354. Data that are stored in memory 366 can include calibration values or corrections based on a calibration, any of the measured or calculated parameters, i.e., current, power (both real and/or apparent), and energy. Any of these data can be accessed from another site over a network 370, such as the Internet or other network, through network interface 352. Optical drive 358 can read a compact disk (CD) 356 (or other optical storage media, such as a digital video disk (DVD)) on which machine instructions are stored for determining and/or displaying any of the electrical parameters (i.e., current, power, and/or energy), as well as other software modules and programs that may be run by computer 364. The machine instructions are loaded into memory 366 before being executed by processor 362 to carry out the steps for determining the electrical parameters using the output signals from the contactless current sensor or simply displaying one or more electrical parameters received from the contactless current/power sensor.

The user can provide input to and/or control computer 364 through keyboard/mouse 372, which is coupled to the computer. A Bluetooth radio 374 is also connected to bus 354 for receiving a Bluetooth radio signal 376, e.g., from the contactless current/power sensor, if provided with a Bluetooth wireless transmitter to transmit the output signal indicative of current and voltage, or outputs of the current, power, and/or energy (if determined by a processor within the contactless current/power sensor). It will be appreciated that other types of wired or wireless communication links can convey the data from the contactless current/power sensor. For example, a Wi-Fi radio signal or an Ethernet or uniform serial bus (USB) wired communication link 384 coupled to a USB port 378 can be used for this purpose instead of the Bluetooth radio. These signals can also be stored as data on a data store 360 and subsequently processed by computer 364, to review electrical current, power, and/or energy usage in a structure.

It is noted that in an initial exemplary embodiment, the RMS values of the output signal from the contactless current sensor were supplied as input signals to a line-in input of a conventional sound card, such as sound card 382, for example, over a wired link 380. The ADC functionality was included in the contactless current/power sensor in that embodiment, and the sound card was used for sampling the RMS signals. However, it will be understood that other techniques can be used for sampling signals supplied to computer 364 over wired link 384, or over a wireless link, such as via a Bluetooth radio signal 376, so that the processing to determine current, power, and energy consumed in a structure can be determined more by computer 364.

Performance Experiments And Results

Experiments were conducted in a single apartment to evaluate the feasibility of this approach. A total of seven experiments (5 trials each) of plugging in combinations of various devices (such as lamps) into the electrical outlet in the apartment were conducted. The calibration unit was first installed into a free electrical outlet so that the software could determine the power ratio of the current sensor and compute a calibrated regression line. These tests used the WATTS UP™ monitoring device to determine the actual power consumption of each device and combination of devices. Table 1 shows the measured power consumption of the combinations tested and the estimated power consumption from the sensor (in Watts). The average power of each trial well as the error is reported in Table 1, below.

TABLE 1

The power consumption of various combinations of devices as detected by the contactless current/power sensor; the Watts Up ™ device was used as the ground truth, or "actual" power, for comparison.

| Device state (on/off) | | | | | |
|---|---|---|---|---|---|
| Lamp 1 60 W | Lamp 2 60 W | Lamp 3 75 W | "Actual" Power (W) | Contactless Sensor (W) | Diff. (%) |
| off | off | off | 0 | 0 | 0 |
| on | off | off | 54.0 | 52.5 | 2.9 |
| off | on | off | 62.6 | 58.9 | 6.3 |
| on | on | off | 122.6 | 124.1 | 1.2 |
| off | on | on | 130.0 | 128.2 | 1.4 |
| on | on | on | 183.3 | 183.0 | 0.1 |

Note that the WATTS UP™ device has its own error profile, but in this feasibility experiment, it was only necessary to show how close the results produced by the present novel approach are to the levels determined by a commercially available device. The initial comparison of these results for purely resistive loads are very encouraging. Overall, the results of the tests show a power consumption difference of less than 3% (on average) from the known measurements (using the WATTS UP™ as ground truth). Single and compound events do not appear to cause any noticeable adverse effects on the sensor. The smallest discernable current draw is about 10 mA, which was gathered through the power consumption of a known LED-based load. The theoretical dynamic range of the exemplary sensor (assuming the offset strap runs at 20 gauss) is over 100 A. The effective dynamic range and resolution is clearly dependant on the connected analog-digital converter (ADC), but it is important to note that the present approach is capable of detecting both low and high electrical loads over a relatively wide range.

Other Alternative Embodiments

There are several features and additional functionality that might be included in other exemplary embodiments of the sensor. For example, since the sensor accuracy and optimal sensitivity depends upon its proper orientation and placement, an alternative embodiment can include an LED-based (or other type of visual and/or audio) indicator that enables the user to quickly determine the optimal orientation and placement of the sensor on the panel of the circuit breaker box. An example of such a feedback indicator device is described below. To use such an embodiment, the user would simply move the sensor around over a surface of the circuit breaker box, at about the recommended mounting location, until the indicator shows a peak or optimal position and best orientation has thus been achieved.

LED Feedback Indicator

The contactless current sensor units can be optimally positioned relative to the main electrical lines being monitored based on feedback visually provided using two LEDs on the sensor to help the user search for this optimal position before mounting the sensor on the circuit breaker box panel. The contactless sensor is held and "hovered" over the circuit breaker panel at about the likely position of the main electrical line inside (similar to the manner in which a wall stud finder is used). The user is assisted in finding the ideal spot to mount this sensor by using a set of heuristics derived from the standards used in the design of circuit breaker panels.

The ends of the sensor are lined up with the ends of the circuit breakers for the two main electrical lines to help in determining an initial position for placement of the sensor. (Note that this discussion assumes that the sensor unit is being positioned to monitor a single phase installation.) When the user has hovered or positioned the sensor housing near a potentially suitable location (based on the signal strength of the electrical current detected by one or both of the internal sensor units flowing in the 60 Hz AC main electrical lines), one or both of the LEDs on the sensor will begin to flash. The LED becomes solid lighted if that part of the sensor unit is above an acceptable location so as to receive a sufficiently strong indication of AC current flowing in the main electrical line being monitored. The goal is to have both LEDs solidly lighted, which indicates both internal sensors are effectively picking up electrical current flowing in the two current carrying main electrical lines. The sensor unit has the ability to be expanded by simply sliding it's housing apart to accommodate older or non-standard circuit breaker panels that do not conform to the NEMA standard. Typically, for standard electric circuit breaker panels, the user would only have to move the device as a unit. A strategy for finding a suitable position for mounting the housing of the sensor unit is to hover it over a likely location and try to get one LED to be solidly lighted. Then, the user can move the housing of the sensor left or right, up or down, and/or slightly rotate it to get the second LED to solidly light. If the user is unable to get both LEDs to be simultaneously solidly lighted, the sensors can be adjusted by moving the two halves of the unit housing to change the separation of the internal sensors.

Monitoring Circuit

Further, because the sensor is extremely sensitive to the effects of large magnetic fields, which can result in de-linearization of the output signal, it would be desirable to include a monitoring circuit to improve the reliability of the sensor. The monitoring circuit would be used to detect large magnetic fields applied to the sensor and would then attempt to correct the problem experienced by the sensor to minimize or eliminate the resulting error, e.g., by degaussing the sensor, which can be done by automatically applying a set/reset pulse to the sensor. Thus, this exemplary embodiment will include a magnetic field strength monitoring circuit and can also include an automatically initiated magnetization cancellation scheme, or at least, can alert the user of the need to degauss the sensor, so that the user can then manually activate a control or the reset switch to degauss the current sensor.

Although the concepts disclosed herein have been described in connection with the preferred form of practicing them and modifications thereto, those of ordinary skill in the art will understand that many other modifications can be made thereto within the scope of the claims that follow. Accordingly, it is not intended that the scope of these concepts in any way be limited by the above description, but instead be determined entirely by reference to the claims that follow.

The invention in which an exclusive right is claimed is defined by the following:

1. A method for sensing electrical power being provided to a structure, the structure comprises (a) two or more branch circuit breakers, (b) two or more branch electrical power lines that supply at least a portion of the electrical power to a first load in the structure, (c) one or more main electrical power lines that supply the electrical power to the two or more branch electrical power lines and receive the electrical power from a power source external to the structure, the two or more branch electrical power lines are electrically coupled to the one or more main electrical power lines at the two or more branch circuit breakers, and (d) a panel located over at least part of the one or more main electrical power lines and at least part of the two or more branch electrical power lines, the first load comprises a total load of all of two or more electrical devices in the structure that are electrically coupled to the two or more branch electrical power lines, the method comprising:

calibrating an array of current sensors by detecting a change in a magnitude of an electrical current in the one or more main electrical power lines after at least one known load of the two or more electrical devices has been electrically coupled to the one or more main electrical power lines, wherein calibrating the array of current sensors comprises accounting for non-linearities in magnetic fields at the panel, calibrating the array of current sensors comprises:

determining a calibration factor using the change in the magnitude of the electrical current in the one or more main electrical power lines;

using the array of current sensors to sense the electrical current flowing in the one or more main electrical power lines;

producing an output signal indicative of the electrical current in the one or more main electrical power lines;

processing the output signal to determine the electrical current flowing in the one or more main electrical power lines, wherein processing the output signal comprises using the calibration factor;

sensing a voltage on at least one of the one or more main electrical power lines; and computing the electrical power being provided to the structure using the voltage and the electrical current flowing in the one or more main electrical power lines, wherein:

the array of current sensors is affixed at a region of a surface of the panel that is located over or near the at least the part of the one or more main electrical power lines wherein the array of current sensors is devoid of being located over the two or more branch electrical power lines under the panel and is devoid of being located over the two or more branch circuit breakers;

the array of current sensors are separated from the one or more main electrical power lines by at least the surface of the panel when the array of current sensors is affixed at the region of the surface of the panel; and the array of current sensors are not electrically coupled or physically coupled to the one or more main electrical power lines or the two or more branch electrical power lines at the panel when the array of current sensors is affixed at the region of the surface of the panel.

2. The method of claim 1, wherein:

calibrating the array of current sensors further comprises:
electrically coupling the at least one known load of the two or more electrical devices to the one or more main electrical power lines; and the method further comprises:
after calibrating the array of current sensors, uncoupling the at least one known load of the two or more electrical devices from the one or more main electrical power lines; and keeping the at least one known load of the two or more electrical devices uncoupled from the one or more main electrical power lines while using the array of current sensors, producing the output signal, processing the output signal, sensing the voltage, and computing the electrical power.

3. The method of claim 1, further comprising:
displaying at least one of a magnitude or a representation of the magnitude of the electrical current flowing in the one or more main electrical power lines, wherein:
processing the output signal comprises:
processing the output signal to determine the magnitude of the electrical current flowing in the one or more main electrical power lines.

4. The method of claim 1, further comprising:
conveying the output signal to a location that is spaced apart from the array of current sensors and the panel.

5. The method of claim 4, wherein:
conveying the output signal to the location uses at least one of:
a wire conductor; or
a wireless transmitter.

6. The method of claim 1, further comprising:
computing a reactive power for a portion of the electrical current that flows through the first load, wherein:
the first load is not purely resistive; and
computing the reactive power comprises using a power level to compute the reactive power.

7. The method of claim 6, further comprising:
determining a phase difference between the portion of the electrical current and the voltage.

8. The method of claim 1, further comprising:
displaying the electrical power being provided to the structure, wherein:
displaying the electrical power being provided to the structure comprises:
displaying at least one of a true power being consumed by the first load, a reactive power being consumed by the first load, or an apparent power being consumed by the first load.

9. The method of claim 8, further comprising:
determining a total amount of energy consumed by the first load during at least one time interval.

10. The method of claim 9, further comprising:
storing at least one of a value or a representation of the value of the total amount of energy consumed during the at least one time interval; and conveying at least one of the value or the representation of the value of the total amount of energy consumed during the at least one time interval to an entity that determines a payment due for the electrical power provided to the structure.

11. The method of claim 1, wherein:
the array of current sensors comprises:
two or more sensing elements; and
each sensing element of the two or more sensing elements is proximate to a different one of the one or more main electrical power lines.

12. The method of claim 1, wherein:
the array of current sensors comprises at least one of:
a magnetoresistive current sensor;
a Hall effect current sensor;
a fluxgate sensor; or
an induction coil.

13. The method of claim 1, further comprising:
affixing the array of current sensors to the region on the surface of the panel that is located over the at least the part of the one or more main electrical power lines, wherein the array of current sensors is devoid of being located over the two or more branch electrical power lines under the panel and is being located over the two or more branch circuit breakers, wherein:
the array of current sensors senses the electrical current flowing in the one or more main electrical power lines using a contactless sensing technique.

14. The method of claim 13, wherein:
the surface of the panel comprises a surface of an electrical circuit breaker panel; and affixing the array of current sensors to the region on the surface of the panel comprises:
removably attaching the array of current sensors to the region of the surface of the electrical circuit breaker panel.

15. A system for monitoring electrical power usage of a structure, the structure having (a) two or more branch circuit breakers, (b) two or more branch electrical power lines that supply at least a portion of the electrical power to a first load in the structure (c) and one or more main electrical power lines that supply the electrical power to the two or more branch electrical power lines and receive the electrical power from an external power source and the structure further having a panel that overlies at least part of the one or more main electrical power lines and at least part of the two or more branch electrical power lines, the two or more branch electrical power lines are electrically coupled to the one or more main electrical power lines at the two or more branch circuit breakers, the system comprising:

an electrical current sensor that is configured to be attached to a surface of the panel without removing the panel to expose the at least the part of the one or more main electrical power lines or the at least the part of the two or more branch electrical power lines that are covered by the panel, the electrical current sensor also configured to sense an electrical current flowing through the one or more main electrical power lines and further configured to produce an output signal that is indicative of the electrical current flowing through the one or more main electrical power lines;

a processing circuit configured to receive the output signal from the electrical current sensor; and a calibration circuit configured to be coupled to at least one electrical line of the one or more main electrical power lines, wherein:

the processing circuit is further configured to calibrate the electrical current sensor by monitoring a magnitude of the electrical current in the one or more main electrical power lines while the calibration circuit is coupled to the at least one electrical line of the one or more main electrical power lines;

the electrical current sensor is configured to be attached to a region of the surface of the panel that is proximate to the at least the part of the one or more main electrical power lines, and that is not at or adjacent to the at least the part of the two or more branch electrical power lines, and that is not at or adjacent to the two or more branch circuit breakers;

the electrical current sensor is not directly physically coupled to the one or more main electrical power lines or the two or more branch electrical power lines at the panel when the electrical current sensor is attached to the region of the surface of the panel;

the electrical current sensor is spaced apart from the one or more main electrical power lines by at least the surface of the panel when the electrical current sensor is attached to the region of the surface of the panel; and the processing circuit is further configured to process the output signal to determine one or more parameters related to the electrical power usage of the structure.

16. The system of claim 15, further comprising:
a display configured to show a magnitude of at least one of the one or more parameters.

17. The system of claim 15, further comprising:
a wireless transmitter configured to convey the output signal to a location that is spaced apart from the electrical current sensor and the panel,
wherein:
the processing circuit is located at the location.

18. The system of claim 15, further comprising:
a wireless transmitter coupled to the electrical current sensor and configured to wirelessly convey the output signal to the processing circuit,
wherein:
the processing circuit is configured to wirelessly receive the output signal.

19. The system of claim 15, further comprising:
a line plug electrically coupled to the processing circuit and configured to couple the processing circuit to an electrical line socket of the structure, wherein:
the processing circuit is further configured to detect a voltage on at least one electrical line of the one or more main electrical power lines; and
the electrical line socket is electrically coupled to at least one of the one or more main electrical power lines.

20. The system of claim 15, wherein:
the one or more parameters comprise at least one of:
a magnitude of the electrical current flowing through the one or more main electrical power lines; or
a magnitude of the at least the portion of the electrical power consumed by the first load,
wherein:
the processing circuit is further configured to determine the magnitude of the at least the portion of the electrical power consumed by the first load.

21. The system of claim 15, wherein:
the processing circuit is further configured to determine a phase difference between at least a portion of the electrical current flowing through at least one of the one or more main electrical power lines and a voltage on the at least one of the one or more main electrical power lines.

22. The system of claim 15, wherein:
the one or more parameters comprise a reactive electrical power;
the first load is not purely resistive; and
the processing circuit is further configured to determine the reactive electrical power.

23. The system of claim 15, wherein:
the processing circuit is further configured to determine a total electrical energy supplied to the first load during a time interval.

24. The system of claim 23, further comprising:
a memory configured to store one or more values for the total electrical energy supplied to the first load during the time interval; and
a communications device for communicating the total electrical energy supplied to the first load during the time interval to at least one of:
an occupant of the structure;
an owner of the structure; or
an electrical power company providing the at least the portion of the electrical power to the structure.

25. The system of claim 15, wherein:
the electrical current sensor comprises two or more sensing elements that are positioned in the electrical current sensor such that each sensing element of the two or more sensing elements can be proximate to a different one of the one or more main electrical power lines when the electrical current sensor is attached to the surface of the panel.

26. The system of claim 15, wherein:
the panel comprises an electrical circuit breaker panel; and
the electrical current sensor further comprises:
an adhesive backing configured to be removably attached to the surface of the electrical circuit breaker panel such that the electrical current sensor is wirelessly coupled to the one or more main electrical power lines to sense the electrical current flowing through the one or more main electrical power lines.

27. The system of claim 15, further comprising:
a display configured to show the one or more parameters; and
a switch configured to enable a user to select a first parameter of the one or more parameters to appear on the display.

28. The system of claim 15, further comprising:
a first computer comprising a processor comprising the processing circuit,
wherein:
the processing circuit comprises one or more machine instructions configured to run on the processor of the first computer; and
the one or more machine instructions include instructions to determine the one or more parameters related to the electrical power usage of the structure.

29. A system to monitor electrical power usage by one or more electrical devices, the one or more electrical devices coupled to an electrical power infrastructure of a structure, the system comprising:
a power consumption measurement device configured to be coupled to a first surface of a circuit breaker box, the circuit breaker box overlying at least part of one or more electrical supply lines of the electrical power infrastructure, the power consumption measurement device comprising multiple current sensor elements configured to wirelessly sense data related to the electrical power usage by the one or more electrical devices;
a processing module configured to run on a first processor and configured to determine a total electrical power usage by the structure by calculating the electrical power usage of the one or more electrical devices in the structure using the data obtained from the multiple current sensor elements of the power consumption measurement device; and
a calibration load configured to be coupled to at least one electrical line of the one or more electrical supply lines,
wherein:
the electrical power infrastructure comprises two or more branch circuit breakers and the at least part of the one or more electrical supply lines;
the at least part of the one or more electrical supply lines comprise two or more branch electrical power lines and one or more main electrical power lines that are electrically coupled to the two or more branch electrical power lines at the two or more branch circuit breakers;
an electrical current sensor is configured to be affixed at a portion of the first surface of the circuit breaker box that is proximate to the one or more main electrical power lines and is devoid of the two or more branch electrical power lines and devoid of the two or more branch circuit breakers;
the electrical current sensor is further configured to be affixed at the portion of the first surface of the circuit breaker box such that at least the first surface of the circuit breaker box is between the electrical current sensor and the one or more main electrical power lines;
the calibration load is configured to be uncoupled from the at least one electrical line of the one or more electrical supply lines;
each of the multiple current sensor elements comprises an induction coil;
the multiple current sensor elements are not electrically coupled or physically coupled to the one or more main electrical power lines or the two or more branch electrical power lines at the circuit breaker box when the electrical current sensor is affixed at the portion of the first surface of the circuit breaker box;
the power consumption measurement device is configured such that the multiple current sensor elements are positioned such that each of the multiple current sensor elements can be proximate to a different one of the one or more electrical supply lines when the power consumption measurement device is coupled to the first surface of the circuit breaker box;
the processing module is further configured to calibrate the multiple current sensor elements by monitoring a magnitude of an electrical current in the one or more electrical supply lines while the calibration load is coupled to the at least one electrical line of the one or more electrical supply lines;
the processing module is further configured to determine a calibration factor using the magnitude of an electrical current in the one or more electrical supply lines while the calibration load is coupled to the at least one electrical line of the one or more electrical supply lines;
the processing module is further configured to process an output signal to determine one or more parameters related to the electrical power usage of the structure using the calibration factor, the output signal indicative of the data wirelessly sensed by the multiple current sensor elements; and
the processing module is further configured to use the calibration factor to at least partially calibrate the electrical current sensor to account for non-linearities of magnetic fields at the circuit breaker box.

30. A method for sensing electrical power being provided to a structure, the structure having two or more branch circuit breakers, two or more branch electrical power lines that supply at least a portion of the electrical power to a first load of two or more electrical devices in the structure and one or more main electrical power lines that supply the electrical power to the two or more branch electrical power lines and receive the electrical power from an external power generator, the structure further having a panel that overlies at least part of the one or more main electrical power lines and the two or more branch electrical power lines, the first load comprises a total load of all of the two or more electrical devices in the structure that are electrically coupled to the two or more branch electrical power lines, the method comprising:
coupling a current sensor to a region of a surface of the panel that is proximate to the one or more main electrical power lines and is devoid of the two or more branch electrical power lines and devoid of the two or more branch circuit breakers, the current sensor is not electrically coupled or physically coupled to the one or more main electrical power lines or the two or more branch electrical power lines at the panel when the current sensor is coupled to the region of the surface of the panel, the current sensor is separated from the one or more main electrical power lines by at least the surface of the panel when the current sensor is coupled to the region of the surface of the panel;
calibrating the current sensor by detecting a change in a magnitude of an electrical current in the one or more main electrical power lines after at least one known load of the two or more electrical devices has been electrically coupled to the two or more branch electrical power lines;
using the current sensor to sense the electrical current flowing in the one or more main electrical power lines after the at least one known load of the two or more electrical devices has been uncoupled from the two or more branch electrical power lines;
producing an output signal indicative of the electrical current in the one or more main electrical power lines;
processing the output signal to determine the electrical current flowing in the one or more main electrical power lines after the at least one known load of the two or more electrical devices has been uncoupled from the two or more branch electrical power lines;

sensing a voltage on at least one of the one or more main electrical power lines; and computing the electrical power being provided to the structure using the voltage and the electrical current flowing in the one or more main electrical power lines after at least one known load of the two or more electrical devices has been uncoupled from the two or more branch electrical power lines.

31. The system of claim 15, wherein:

the processing circuit is further configured to determine a calibration factor using the magnitude of the electrical current in the one or more main electrical power lines while the calibration circuit is coupled to the at least one electrical line of the one or more main electrical power lines; and the processing circuit is further configured to process the output signal to determine one or more parameters related to the electrical power usage of the structure, wherein the calibration factor is used to at least partially process the output signal.

\* \* \* \* \*